United States Patent
Tsutsui et al.

[11] Patent Number: 5,939,735
[45] Date of Patent: Aug. 17, 1999

[54] SEMICONDUCTOR LIGHT EMITTING DEVICE

[75] Inventors: Tsuyoshi Tsutsui; Shunji Nakata; Yukio Shakuda; Masayuki Sonobe; Norikazu Itoh, all of Kyoto, Japan

[73] Assignee: Rohm Co., Ltd., Kyoto, Japan

[21] Appl. No.: 08/993,091

[22] Filed: Dec. 18, 1997

[30] Foreign Application Priority Data

Dec. 24, 1996 [JP] Japan .................................. 8-342940

[51] Int. Cl.⁶ .................................................. H01L 33/00
[52] U.S. Cl. ............................................................ 257/98
[58] Field of Search .................................. 257/98, 94, 82, 257/190, 191, 200, 91, 436; 349/25

[56] References Cited

U.S. PATENT DOCUMENTS

| | | | |
|---|---|---|---|
| 4,973,136 | 11/1990 | Braatz | 349/25 |
| 5,055,893 | 10/1991 | Sasagawa | 257/98 |
| 5,132,750 | 7/1992 | Kato et al. | 257/98 |
| 5,384,649 | 1/1995 | Takimoto et al. | 349/25 |

FOREIGN PATENT DOCUMENTS 402039578  2/1990  Japan ...................... 257/98

*Primary Examiner*—David B. Hardy
*Assistant Examiner*—Huy Bui
*Attorney, Agent, or Firm*—Nikaido Marmelstein Murray & Oram LLP

[57] ABSTRACT

A semiconductor light emitting device includes a substrate and semiconductor overlying layers formed on the substrate. A light emitting layer is formed in the semiconductor layer so as to emit light. The substrate is transmittable of the light emitted by the light emitting layer. A light reflecting layer is formed on a part of a back surface of the substrate. As a result, a semiconductor light emitting device is obtainable by easily dividing a wafer having thereon a light emitting film through recognizing, from a wafer back side, semiconductor layer chip pattern formed overlying the main surface of the wafer.

8 Claims, 3 Drawing Sheets

5,939,735

SEMICONDUCTOR LIGHT EMITTING DEVICE

BACKGROUND OF THE INVENTION

This invention relates to a semiconductor light emitting device which has a light reflecting film formed on the back surface of a substrate transmittable of the light emitted by the light emitting layer so that the light is radiated through the surface of semiconductor layers formed overlying the substrate. More particularly, this invention is concerned with a semiconductor light emitting device which is formed by a chip into which a substrate wafer is sliced (wherein groove lines are formed by using a diamond cutter) with the wafer easily positioned in position.

There is a known method of enhancing the light radiation efficiency for semiconductor light emitting devices that are adapted to radiate light transmitted through a substrate thereof, wherein a light reflecting film is formed on the back surface of the substrate so that the portion of the light emitted toward the back surface of the substrate can be effectively reflected by the light reflecting film, thereby improving light radiation efficiency. For example, the light emitting device for bluish light radiation (e.g. from ultraviolet ray to yellow portion) has gallium-nitride based semiconductor layers epitaxially grown on a sapphire ($Al_2O_3$ single crystal) substrate transmittable of bluish light therethrough.

The semiconductor light emitting device having such gallium-nitride based semiconductor, layers for bluish light radiation is basically structured as shown in FIG. 4. That is, the semiconductor light emitting device includes a sapphire substrate 21. The sapphire substrate 21 has thereon a low-temperature buffer layer 22, e.g. of GaN, an n-type layer (cladding layer) 23 of n-type GaN epitaxially grown at a high temperature on the buffer layer 22, an active layer (light emitting layer) 24, e.g. of InGaN-based compound semiconductor having a bandgap energy lower than that of the cladding layer to define an emission light wavelength, and a p-type layer (cladding layer) of p-type GaN. Incidentally, the "InGaN-based" means a chemical composition having In and Ga variable in content ratio. The semiconductor layers has a p-side electrode 28 on a surface thereof and an n-side electrode 29 on a surface of the n-type layer 23 exposed by partly etching the overlying semiconductor layers. With such structure, a light reflecting film 21a is formed for example by an Al thin film over the entire back surface of the substrate 21 in order to reflect toward the p-side electrode 28 and hence effectively utilize the light travelling toward the substrate.

In the meanwhile, the semiconductor light emitting device of this kind is constituted by a chip having a size, for example, of 360 μm by 360 μm. That is, a multiplicity of chips are manufactured through wafer processing using a circular wafer having a diameter of approximately 2 inches so that the wafer being processed is finally divided into individual chips thereby providing light emitting devices. The wafer division is generally through dicing processes. However, where the wafer is, for example, too hard and hence difficult to carry out dicing thereon, e.g. as in the case of a sapphire wafer formed thereon with gallium-nitride based semiconductor layers for light emission, the wafer is subjected at its back surface to slicing using a diamond pen so as to be broken into individual chips.

However, if the light reflect film is formed covering over the entire back surface of the wafer, the semiconductor layer chip pattern existing on the main surface of the wafer is impossible to recognize as viewed the back surface side of the wafer during slicing the back surface to divide the wafer in a manner stated above. This result in difficulty in positioning for slicing operations on the wafer.

SUMMARY OF THE INVENTION

It is therefore the object of the present invention to provide a semiconductor light emitting device which is obtainable by easily dividing a wafer having a light reflecting film on the back surface, by recognizing the chip pattern of the semiconductor layers formed overlying the main surface of the wafer, from wafer back side.

In accordance with the present invention, there is provided a semiconductor light emitting device comprising:

a substrate;

semiconductor overlying layers formed on the substrate;

a light emitting layer formed in the semiconductor overlying layers so as to emit light;

wherein the substrate is transmittable of the light emitted by the light emitting layer; and a light reflecting film formed on a part of a back surface of the substrate.

Here, the wording "formed on a part of" means the provision of the light reflecting film in an arbitrary form including circular or rectangular form that is patterned in a regularly repetitive or irregularly dotted manner wherein the pattern may be a lattice or reticulate pattern, so that the film non-formed portions are dotted discontinuously.

With such structure, the device is improved in light radiation efficiency on the front side thereof by reflecting the light at the film-formed portions, while during manufacture the semiconductor layer chip pattern is recognizable through the film non-formed portions on the substrate wafer. This facilitates the recognition of positions to be sliced, thereby facilitating wafer dividing operations into individual chips.

If the total area of the light reflecting film is determined 50 to 90% of the area of the substrate back surface, the semiconductor layer chip pattern can be preferably recognized from the back surface side of the substrate wafer without degradation in light reflecting efficiency.

The above described objects and other objects, features, aspects and advantages of the present invention will become more apparent from the following detailed description of the present invention when taken in conjunction with the accompanying drawings.

DETAILED DESCRIPTION

Figure 1:
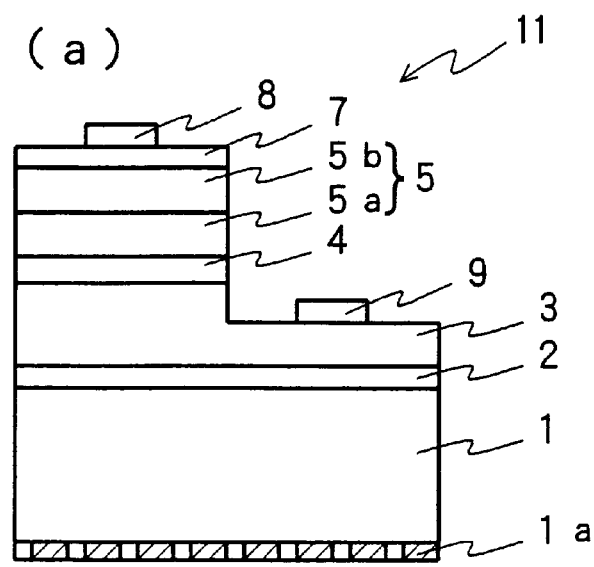
FIGS. 1(a) to 1(c) are explanatory views of a semiconductor light emitting device according to one embodiment of the present invention.
Figure 1:
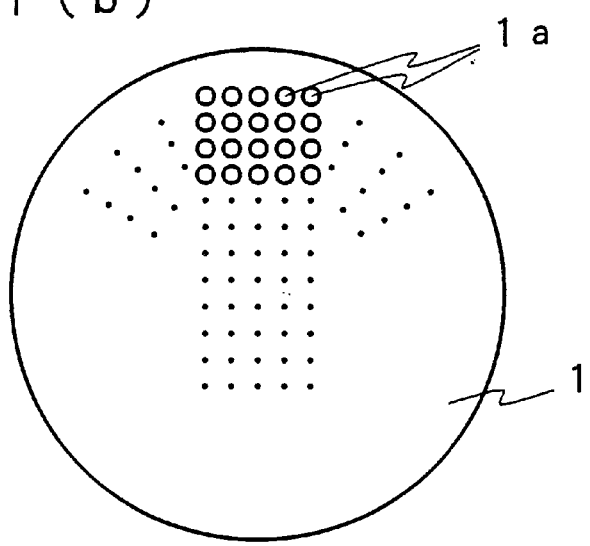
Figure 1:
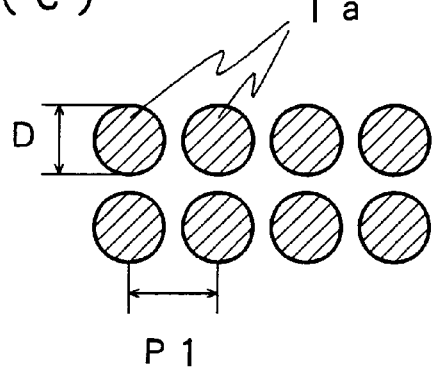

Referring first to FIG. 1, there is illustrated a semiconductor light emitting device according to the present invention, wherein FIG. 1(a) is a sectional explanatory view of the device, while FIG. 1(b) is a bottom view thereof in a wafer state. The light emitting device has a sapphire substrate and semiconductor layers of gallium-nitride based compound semiconductors formed thereon, being adapted for emitting for example bluish light.

Here, gallium-nitride based semiconductor refers to a semiconductor of a compound of group-III element Ga and group-V element N wherein part of the group-III element Ga may be substituted by other group III elements such as Al or In and/or part of the group-V element N be substituted by other group V elements such as P or As.

The semiconductor light emitting device of the present invention, as shown in FIG. 1, comprises a substrate 1 formed of sapphire ($Al_2O_3$ single crystal) and semiconductor layers 2–5 formed to provide therein a light emitting layer on the substrate 1. The semiconductor light emitting device also has a p-side electrode 8 formed on the surface of the semiconductor layers through the formation of a diffusion metal layer 7, and an n-side electrode 9 formed on a surface of an n-type semiconductor layer 3 that is exposed by partly etching the overlying semiconductor layers 3–5. Furthermore, a light reflecting film 1a is partly provided in a manner of being spotted on the back surface of the substrate 1.

The semiconductor layers 3–5 on the substrate 1 includes a low-temperature buffer layer 2 formed by depositing, for example, GaN to a layer thickness of approximately 0.01–0.2 μm. On the low-temperature buffer layer 2, an n-type layer 3 as a cladding layer is formed by depositing to a layer thickness of approximately 1–5 μm. On the n-type layer 3, an active layer 4 is formed of a material, e.g. an InGaN-based semiconductor, having a bandgap energy smaller than that of the cladding layer to a layer thickness of approximately 0.05–0.3 μm. On the light emitting layer 4, a p-type layer (cladding layer) 5 is formed by growing to a layer thickness of approximately 0.2–1 μm. This p-type layer 5 is formed by a p-type AlGaN-based compound semiconductor sublayer 5a and a GaN sublayer 5b, wherein the "AlGaN-based" means a material having a ratio of Al and Ga that may be variable.

The p-type layer 5 is of the double-layered structure with the AlGaN-based compound semiconductor sublayer 5a and the GaN sublayer 5b, as stated above. This is because the p-type layer 5 is preferably provided with an Al-contained layer in order to enhance the effect of confining carriers within the active layer. It is however possible to form the p-type layer 5 alternatively by a single GaN layer. On the other hand, the n-type layer may be alternatively of a double-layered structure by providing an AlGaN-based compound semiconductor sublayer. Alternatively, these p-type and n-type cladding layers can be formed using other gallium-nitride compound semiconductor layer(s). Furthermore, although the present example is of a double hetero junction structure having the active layer sandwiched between the n-type layer and the p-type layer, the device may be of a p/n junction structure having a direct junction of an n-type layer and a p-type layer.

The semiconductor light emitting device has a light reflecting layer 1a formed on the back surface of the substrate 1 is that part of the light emitted from the active layer 4 toward the substrate 1 can be reflected by the reflecting layer 1a and radiated frontward through the surface of the overlying semiconductor layers. The light reflecting layer 1a is formed by vacuum-depositing a high light-reflective metal such as aluminum or silver, or by sputtering a high light-reflective metal oxide such as magnesium oxide, titanium oxide, barium sulfide or aluminum oxide or a high light-reflective ceramics. The light reflecting layer 1a, if formed to a film thickness of approximately 0.1–1 μm, can sufficiently serve to reflect the light emitted by the active layer 4. The preset invention is characterized by the light reflecting film 1a which is formed, during manufacture, in a polka-dotted form on the back surface of a wafer as an undivided substrate, instead of being provided covering the entire back surface thereof, as shown in a wafer bottom view of FIG. 1(b).

To provide a light reflecting layer 1a on part of the wafer back surface, a film is first formed by vacuum evaporation or sputtering over the entire back surface of a substrate and then the film thus formed is party etched away through patterning a photo-resist layer. In another method, the light reflecting layer 1a may be formed by a lift-off technique wherein a photo-resist layer is previously formed by patterning to be left at non-forming portions of a light reflecting layer, and then an evaporation or sputter film is film-formed thereover, followed by removing off the photo-resist layer. The lift-off method is more convenient because metal oxides or ceramics are high in etch-photo-resistances.

Figure 3:
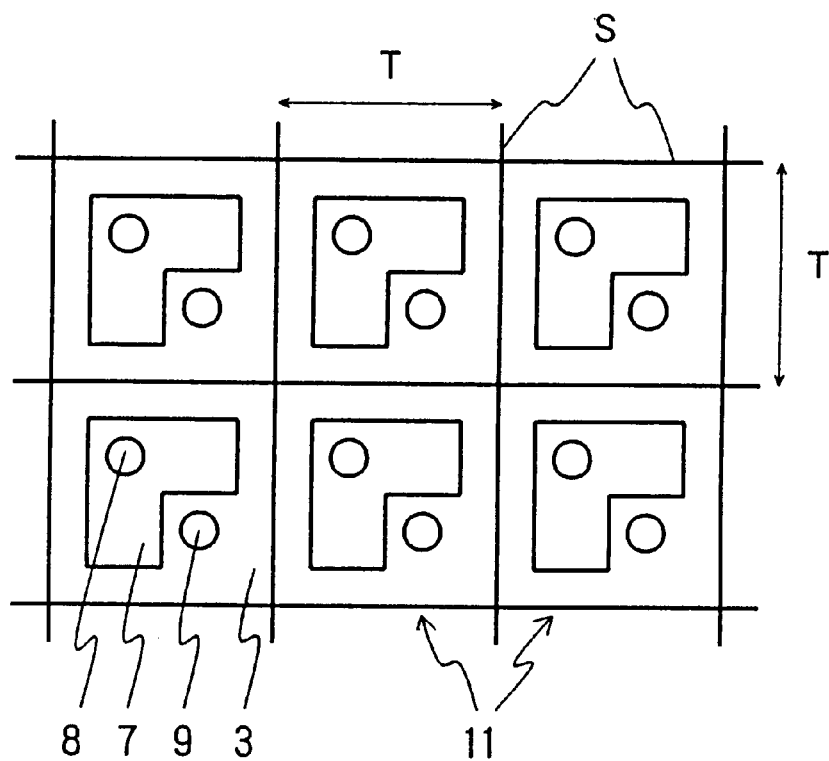
FIG. 3 is a view showing a chip pattern provided on a wafer.
Figure 4:
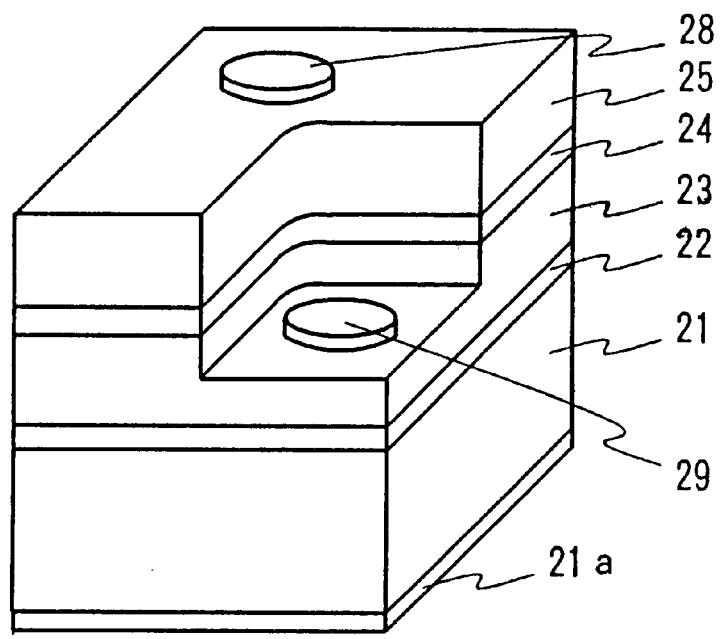
FIG. 4 is a perspective explanatory view of a conventional semiconductor light emitting device as one example.

The light reflecting film 1a is formed such that the polka dots, for example, have a diameter D of approximately 100–150 μm (see FIG. 1(c)) to be arrayed at an interval pitch P1 of approximately 100–150 μm (see FIG. 1(c)). The size and the pitch for the reflective film polka dots are determined depending upon the relationship of the chip pattern size and the desired light reflectivity. The chips 11 are formed, for example, in a matrix pattern form on a surface of the wafer or undivided substrate as shown in a partly magnified plan view of FIG. 3, so that they are divided along slicing lines S extending therebetween. As will be understood, if the light reflecting film is formed in such a pattern that the slicing lines S can be recognized as viewed from the back surface side of the wafer, the more increased area of the light reflective film is favorably, because the light reflectivity increases with the increase in the area of the light reflecting film. Incidentally, in FIG. 3 reference characters 8 and 9 respectively denote a p-side electrode and an n-side electrode, wherein the n-type layer 3 is exposed at a portion where the overlying semiconductor layers are partly etched away while a diffusion metal layer 7 is given in at a rising portion including the p-type layer 5 left in a mesa-form.

According to the present invention, since the light reflecting film is partly provided on the back surface of the substrate wafer in such a pattern that the presence and absence of the light reflecting film are given in a repeated manner as stated above, it is possible to recognize the chip pattern of the semiconductor layers overlying on the main surface of the substrate through gaps between the light reflecting film portions. Accordingly, the boundary areas between the chips can be recognized with accuracy from the back surface side of the substrate wafer, making possible division of the wafer from the back surface side thereof into individual chips. On the other hand, the divided chip or light emitting device has a light reflecting film covering the greater portion of the back surface of the substrate excepting the gap portion. As a result, the light emitting device can reflect, by the light reflecting film, the light emitted from the light emitting layer toward the substrate side thereby radiating the same light toward the front of the device. Therefore, there is obtained an increase in light radiation efficiency, i.e. the rate of light that can be outwardly radiated from the light emitting layer through the surface of the semiconductor layers.

The partly-formed light reflecting film of the invention is provided to allow recognition of the semiconductor overlying layer pattern from the back side of the substrate. Consequently, it is preferred that the pattern pitch of the light reflecting film is determined smaller than the chip one side (usually in a square with one side length T of approximately 300–400 μm) so that the gap corresponds to the slicing line S. It should be noted, as to light reflectivity, that there may occur some reflections of the emitted light at non-film formed portions on the substrate, e.g. at the adhesive applied during die-bonding the chip 11 onto a lead or a die pad of the lead. As a result of studies and considerations by the present inventor, it has been found that, if the light reflecting film is provided so as to cover the back surface of the substrate to an extent of 50–90%, the resulting device is satisfactorily high in light radiation efficiency which is obtainable through recognition of the chip pattern during slicing the wafer into individual chips.

Figure 2:
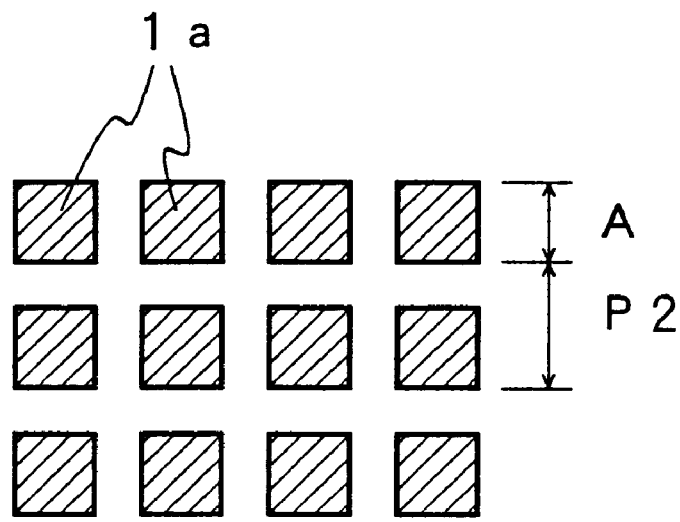
FIGS. 2(a) and 2(b) are illustrative views showing other pattern examples of the light reflecting film provided on the back surface of a substrate.
Figure 2:
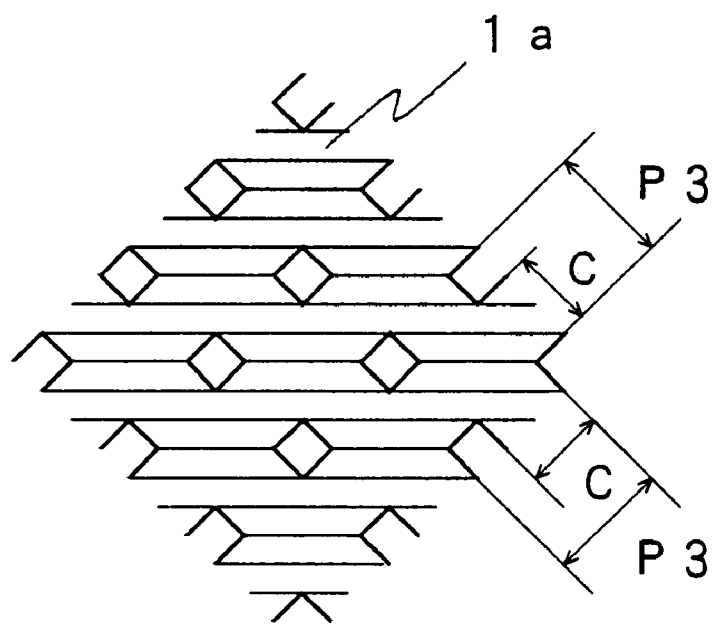

The light reflecting film 1a, if provided in a circular pattern on the wafer as described above, preferably has gaps through which slicing lines S can be recognized. Alternatively, the light reflecting film 1a may be partly provided in other pattern forms such as a quadrilateral form or a grid form as shown in FIGS. 2(a) and 2(b), instead of the circular form. Where the reflecting film pattern is provided in a squared form as shown in FIG. 2(a), the square's one side A is of a dimension of approximately 100–150 μm with an interval pitch P2 of approximately 150–200 μm. Where the light reflecting film pattern is provided in a lattice or grid form as shown in FIG. 2(b), the width C of the light reflecting film 1a is, for example, of a dimension of approximately 50–80 μm with the pitch P3 of approximately 80–100 μm.

In the above embodiments, the light reflective film patterns are in a regularly repeated pattern form. With such repeated pattern form, the semiconductor chips to be divided and the light reflecting film therefor can be provided in patterns of the same pitch. With such arrangement, it is possible to recognize dividing positions through the light reflecting film pattern, thereby facilitating the positioning in position of a diamond pen during slicing. However, the light reflecting film may be of a random pattern provided that it is partly formed to give gaps therein.

Now explanations will be made for the method of manufacturing a semiconductor light emitting device according to the present invention. First prepared is a sapphire substrate wafer having a diameter of approximately 2 inches, which is placed in a semiconductor layer forming apparatus. Semiconductor layers are formed on the wafer by an ordinary method so as to provide a light emitting layer therein, followed by forming electrodes. Thereafter, the wafer is taken out of the semiconductor layer forming apparatus, and put upside down in a vacuum evaporation apparatus to carry out evaporation of Al on the back surface of the wafer to a film thickness of approximately 0.1–1 μm. Then the photoresist film is formed on the Al-evaporated surface and then patterned to a desired form. The Al exposed by the photoresist pattern is etched away with using dilute hydrochloric acid, a mixture solution of acetic acid and phosphoric acid or a sodium hydroxide solution. Thus, a light reflecting film 1a is formed, for example, in a polka dot pattern as shown in FIG. 1(b). Incidentally, it is preferred that the sapphire substrate wafer prior to the deposition process is subjected to lapping to reduce its thickness in order to facilitate breakage into individual chips. It is also preferred that the back surface of the sapphire wafer, during lapping, is mirror finished to enhance the efficiency of light reflection.

Thereafter, the wafer is placed upside down on a slicing apparatus so as to be observed at the semiconductor layer mesa-form formed on the opposite side of the wafer through the film non-formed portions. Thus, the position to be sliced is appropriately recognized along a boundary line extending between the chip-forming portions. Thus, the wafer is aligned in position so that the slicing can be performed at proper positions. In this manner, slicing is made for the wafer at a constant interval. After completing slicing in one direction, slicing is then made in a direction of 90 degrees relative to the above direction. Thus, the wafer is broken at a slicing position into individual chips. As a result, a semiconductor light emitting device is obtained as shown in FIG. 1(a).

According to the present invention, the chip pattern of the semiconductor layers on the wafer main surface can be recognized through the portions where no light reflecting film is formed during slicing the wafer into individual chips, facilitating positioning for slicing and hence enhancing operational efficiencies. Moreover, the accurately positioned slicing contributes to the improvement in manufacture yield. In addition, the resultant semiconductor light emitting device has the light reflecting film on the back side of the substrate thereof, being improved in light radiation efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:

a substrate made of sapphire;

semiconductor overlying layers made of gallium-nitride based compound semiconductor formed on said substrate;

a light emitting layer formed in said semiconductor overlying layers so as to emit light;

wherein said substrate is transmittable of the light emitted by said light emitting layer; and a light reflecting film pattern formed on a whole back surface of said substrate so that a peripheral part of a chip is at least partially exposed.

2. A semiconductor light emitting device according to claim 1, wherein said light reflecting film pattern is provided in a circular or rectangular regular pattern form.

3. A semiconductor light emitting device according to claim 1, wherein said light reflecting film pattern is provided in an irregularly and dotted pattern form.

4. A semiconductor light emitting device according to claim 1, wherein said light reflecting film pattern is provided in a reticulate pattern form so that portions free of said light reflecting film pattern are dotted on the back surface of said substrate.

5. A semiconductor light emitting device according to claim 1, wherein said light reflecting film pattern is formed of a metal having high light reflectivity.

6. A semiconductor light emitting device according to claim 1, wherein said light reflecting film pattern is formed of a metal oxide or ceramics that has a high light reflectivity.

7. A semiconductor light emitting device according to claim 1, wherein said light reflecting film pattern covering the back surface of said substrate is in a total area of 50 to 90% with respect to the back surface area of said substrate.

8. A semiconductor light emitting device according to claim 1, wherein said light reflecting film pattern being formed such that slicing lines can be recognized when viewed from said back surface of said substrate.

* * * * *